United States Patent
Miao et al.

(10) Patent No.: US 12,301,202 B2
(45) Date of Patent: May 13, 2025

(54) BULK ACOUSTIC WAVE RESONATOR WITH SLIT

(71) Applicant: SV SensTech (WUXI) Co., Ltd., Wuxi (CN)

(72) Inventors: Jianmin Miao, Shanghai (CN); Ruizhen Zhang, Shanghai (CN)

(73) Assignee: SV SensTech (WUXI) Co., Ltd., Wuxl (CN)

( * ) Notice: Subject to any disclaimer, the term of this patent is extended or adjusted under 35 U.S.C. 154(b) by 913 days.

(21) Appl. No.: 17/438,879

(22) PCT Filed: Aug. 7, 2020

(86) PCT No.: PCT/CN2020/107912
§ 371 (c)(1),
(2) Date: Sep. 13, 2021

(87) PCT Pub. No.: WO2021/036758
PCT Pub. Date: Mar. 4, 2021

(65) Prior Publication Data
US 2022/0158605 A1 May 19, 2022

(30) Foreign Application Priority Data
Aug. 30, 2019 (CN) .......................... 201910818904.8

(51) Int. Cl.
*H03H 9/02* (2006.01)
(52) U.S. Cl.
CPC ...... *H03H 9/0211* (2013.01); *H03H 9/02015* (2013.01)

(58) Field of Classification Search
CPC ............. H03H 9/0211; H03H 9/02047; H03H 9/02118; H03H 9/02015; H03H 9/02086; H03H 9/15; H03H 3/02
See application file for complete search history.

(56) References Cited

U.S. PATENT DOCUMENTS 10,382,870 B2 * 8/2019 Zhan .................... H04R 19/04
2019/0097603 A1 3/2019 Choi

FOREIGN PATENT DOCUMENTS

| CN | 104202010 A | 12/2014 |
|----|-------------|---------|
| CN | 106817917 A | 6/2017 |
| CN | 108566174 A | 9/2018 |
| CN | 108649916 A | 10/2018 |

(Continued)

OTHER PUBLICATIONS

Machine translation of Gao et al. (CN104202010) "Hollow Cavity-Type Film Bulk Acoustic Resonator and Production Method for same" Dec. 10, 2014 (Year: 2014).*

(Continued)

*Primary Examiner* — Emily P Pham
(74) *Attorney, Agent, or Firm* — Morgan, Lewis & Bockius LLP

(57) ABSTRACT

Provided is a bulk acoustic wave resonator. The bulk acoustic wave resonator includes a first electrode, a piezoelectric layer and a second electrode, where the piezoelectric layer is disposed between the first electrode and the second electrode, the piezoelectric layer is provided with at least one slit, and along a direction pointing from the first electrode to the second electrode, the at least one slit penetrates through at least the piezoelectric layer.

6 Claims, 3 Drawing Sheets

(56) References Cited

FOREIGN PATENT DOCUMENTS

| | | |
|---|---|---|
| CN | 109474252 A | 3/2019 |
| CN | 110417375 A | 11/2019 |
| CN | 210157156 U | 3/2020 |
| JP | 2007208728 A | 8/2007 |
| KR | 20030034639 A | 5/2003 |

OTHER PUBLICATIONS

International Search Report for Application No. PCT/CN2020/107912, dated Oct. 28, 2020, 6 pages including translation.
Chinese Office Action for Application No. 201910818904.8, dated Feb. 29, 2024, 13 pages including translation.

* cited by examiner

BULK ACOUSTIC WAVE RESONATOR WITH SLIT

CROSS-REFERENCES TO RELATED APPLICATIONS

This application is a national stage application filed under 35 U.S.C. 371 based on International Patent Application No. PCT/CN2020/107912, filed on Aug. 7, 2020, which claims priority to Chinese Patent Application No. 201910818904.8 filed with the CNIPA on Aug. 30, 2019, disclosures of which are incorporated herein by reference in their entireties.

TECHNICAL FIELD

Embodiments of the present disclosure relates to resonance technologies and, in particular, to a bulk acoustic wave resonator.

BACKGROUND

Film bulk acoustic resonator (FBAR) filters are a kind of products occupying the largest share of the market of micro-electro-mechanical system (MEMS) products and are widely used in radio frequency data communication products such as mobile phones, particularly 5G communication products. An ideal bulk acoustic wave resonator used for a radio frequency FBAR filter is an acoustic stack composed of an upper electrode, a piezoelectric layer and a lower electrode. The resonator has the advantages of a small size and good performance, and is applicable to mass production using wafers of integrated circuits.

The bulk acoustic wave resonator excites longitudinal modes along a thickness direction, and the longitudinal modes are main parameters determining factors such as frequency and quality factor of the resonator. However, an existing bulk acoustic wave resonator will also generate transverse modes during the working process, so that noise is formed, and the performance of the bulk acoustic wave resonator is affected. Therefore, noise reduction has become an urgent problem to be solved in the field of bulk acoustic wave resonators.

SUMMARY

The present disclosure provides a bulk acoustic wave resonator, in which transverse standing waves are reduced, so that noise is reduced and the performance of the bulk acoustic wave resonator is improved.

The present disclosure provides a bulk acoustic wave resonator.

The bulk acoustic wave resonator includes a first electrode, a piezoelectric layer and a second electrode, and the piezoelectric layer is disposed between the first electrode and the second electrode.

The piezoelectric layer is provided with at least one slit, and along a direction pointing from the first electrode to the second electrode, the at least one slit penetrates through at least the piezoelectric layer.

Optionally, along the direction pointing from the first electrode to the second electrode, the at least one slit penetrates through the first electrode and the second electrode.

Optionally, an orthogonal projection of the at least one slit on the first electrode is not parallel to any side of an orthogonal projection of the piezoelectric layer on the first electrode.

Optionally, a shape of the orthogonal projection of the at least one slit on the first electrode includes a rectangle, an ellipse or a trapezoid.

Optionally, a width of the orthogonal projection of the at least one slit on the first electrode ranges from 5 μm to 15 μm.

Optionally, the piezoelectric layer is provided with at least two slits.

Optionally, the at least two slits are not parallel to each other.

Optionally, the at least two slits are asymmetrical.

Optionally, a shape of an orthogonal projection of the resonator on the first electrode is a circle, a square or a rectangle.

In embodiments of the present disclosure, the piezoelectric layer is provided with the at least one slit, and along the direction pointing from the first electrode to the second electrode, the at least one slit penetrates through at least the piezoelectric layer. The slit can reflect transverse acoustic waves to a certain extent and can reduce the generation of transverse standing waves, so that the noise is reduced and the performance of the bulk acoustic wave resonator is improved.

DETAILED DESCRIPTION

Figure 1:
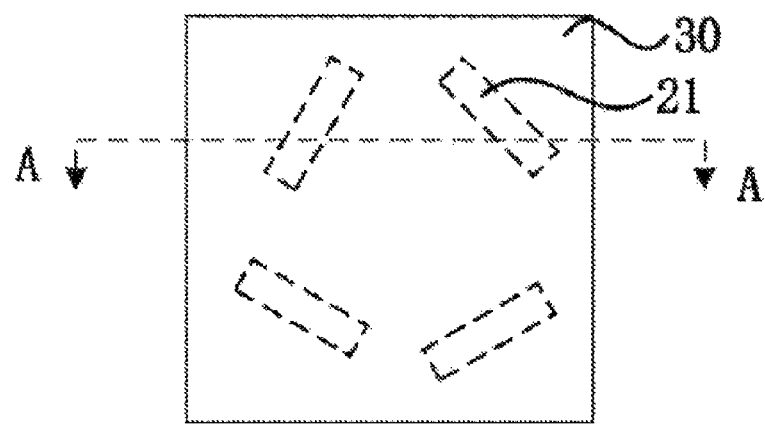
FIG. 1 is a top view of a bulk acoustic wave resonator according to an embodiment of the present disclosure.

The present disclosure is further described below in detail in conjunction with drawings and embodiments. It is to be understood that the embodiments described herein are merely intended to explain the present disclosure and not to limit the present disclosure. Additionally, it should be noted that for ease of description, merely part, not all, of the structures related to the present disclosure are illustrated in the drawings.

The embodiment provides a bulk acoustic wave resonator. FIG. 1 is a top view of a bulk acoustic wave resonator according to an embodiment of the present disclosure, and FIG. 2 is a sectional view of the bulk acoustic wave resonator of FIG. 1 taken along a section line AA.

Figure 2:
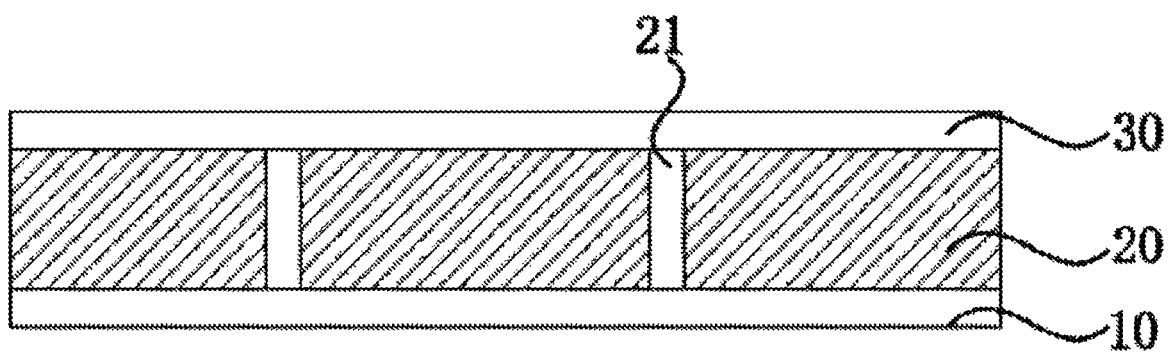
FIG. 2 is a sectional view of the bulk acoustic wave resonator of FIG. 1 taken along a section line AA.

Referring to FIGS. 1 and 2, the bulk acoustic wave resonator includes a first electrode 10, a piezoelectric layer 20 and a second electrode 30, and the piezoelectric layer 20 is disposed between the first electrode 10 and the second electrode 30.

The piezoelectric layer 20 is provided with at least one slit 21, and along a direction pointing from the first electrode 10 to the second electrode 30, the at least one slit 21 penetrates through at least the piezoelectric layer 20.

The direction pointing from the first electrode 10 to the second electrode 30 is a thickness direction of the piezoelectric layer 20. The first electrode 10 and the second electrode 30 are conductive layers, and the piezoelectric layer 20 is made of a piezoelectric material. When alternating current signals with a certain frequency is applied to the first electrode 10 and the second electrode 30, the piezoelectric layer 20 is deformed to generate longitudinal acoustic wave signals (acoustic wave signals in the thickness direction), that is, desired signals. However, when generating longitudinal acoustic wave signals, the piezoelectric layer 20 also generates transverse acoustic wave signals, which affect the performance of the resonator. In the embodiment of the present disclosure, the piezoelectric layer 20 is provided with the at least one slit 21, and along the direction pointing from the first electrode 10 to the second electrode 30, the at least one slit 21 penetrates through at least the piezoelectric layer 20. The slit 21 can reflect transverse acoustic wave signals to a certain extent and can reduce the generation of transverse standing waves, so that noise is reduced and the performance of the bulk acoustic wave resonator is improved.

Figure 3:
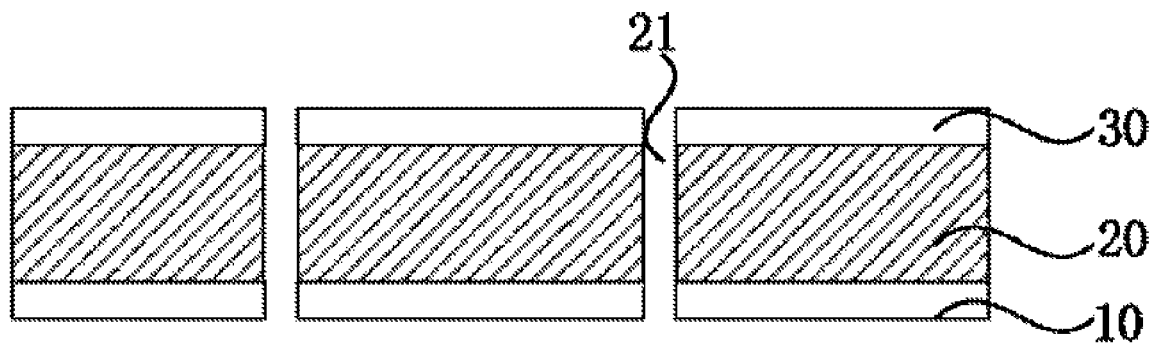
FIG. 3 is a sectional view of another bulk acoustic wave resonator according to an embodiment of the present disclosure.

FIG. 3 is a sectional view of another bulk acoustic wave resonator according to an embodiment of the present disclosure. Optionally, referring to FIG. 3, along the direction pointing from the first electrode 10 to the second electrode 30, the slit 21 penetrates through the first electrode 10 and the second electrode 30.

With this setting, transverse waves can be reflected to the maximum extent along a thickness direction of the resonator (the thickness direction of the piezoelectric layer 20) at the position where the slit 21 is located, so that the formation of transverse standing waves is further reduced and the noise is reduced.

Optionally, an orthogonal projection of the slit 21 on the first electrode 10 is not parallel to any side of an orthogonal projection of the piezoelectric layer 20 on the first electrode 10.

Specifically, the orthogonal projection of the slit 21 on the first electrode 10 is not parallel to any side of the orthogonal projection of the piezoelectric layer 20 on the first electrode 10, that is, the slit 21 is not parallel to any side surface of the piezoelectric layer 20.

If the orthogonal projection of the slit 21 on the first electrode 10 is parallel to a side of the orthogonal projection of the piezoelectric layer 20 on the first electrode 10, transverse waves may be reflected between the side and the slit 21 and thus standing waves are formed. The slit 21 is not parallel to any side of the orthogonal projection of the piezoelectric layer 20 on the first electrode 10, thus the slit 21 and the side surface of the piezoelectric layer 20 are arranged crosswise at a set angle. The transverse waves are reflected between the slit 21 and the side surface of the piezoelectric layer 20, and reflection directions of waves between the slit 21 and the side surface of the piezoelectric layer 20 are not parallel to each other, so that the formation of transverse standing waves is further reduced, the noise is further reduced, and the performance of the resonator is improved.

Figure 4:
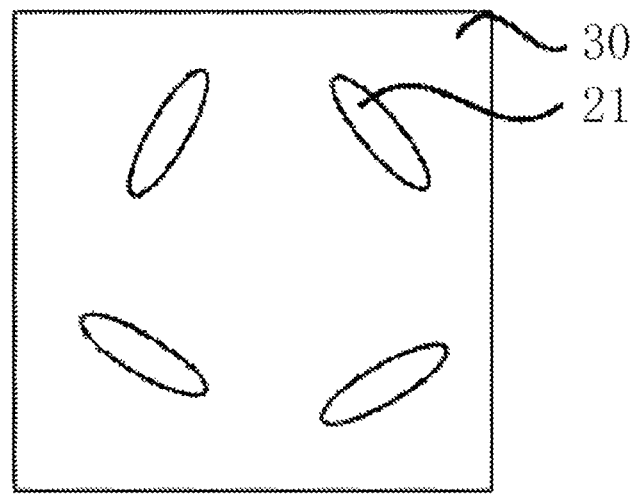
FIG. 4 is a top view of another bulk acoustic wave resonator according to an embodiment of the present disclosure.

FIG. 4 is a top view of another bulk acoustic wave resonator according to an embodiment of the present disclosure. Optionally, referring to FIGS. 1 and 4, a shape of the orthogonal projection of the slit 21 on the first electrode includes a rectangle, an ellipse or a trapezoid.

Specifically, rectangular or elliptical slits are relatively easy to manufacture technically. Therefore, the shape of the orthogonal projection of the slit 21 on the first electrode is a rectangle, an ellipse or a trapezoid, so that the noise is reduced, the performance of the resonator is improved, and the process difficulty is reduced at the same time.

It should be noted that the shape of the orthogonal projection of the slit 21 on the first electrode is not limited to a rectangle, an ellipse and a trapezoid, and may also be other shapes.

Optionally, a width of the orthogonal projection of the slit 21 on the first electrode ranges from 5 μm to 15 μm.

Specifically, the width of the slit 21 is the size of a short side of the slit 21. If the width is relatively small, the processing of the slit 21 is relatively difficult. If the width is relatively large, the area occupied by the slit 21 is too large, which is easy to affect the structural strength of the bulk acoustic wave resonator. The width of the orthogonal projection of the slit 21 on the first electrode 10 ranges from 5 μm to 15 μm, so that the process difficulty is reduced, the bulk acoustic wave resonator is ensured to have a relatively high structural strength, and thus cracks in the resonator caused by external impact are avoided.

Optionally, the piezoelectric layer 20 is provided with at least two slits 21.

Specifically, multiple slits 21 are provided, so that transverse waves are reflected between the multiple slits 21 and multiple sides of the bulk acoustic wave resonator, and the formation of standing waves is further reduced.

Figure 5:
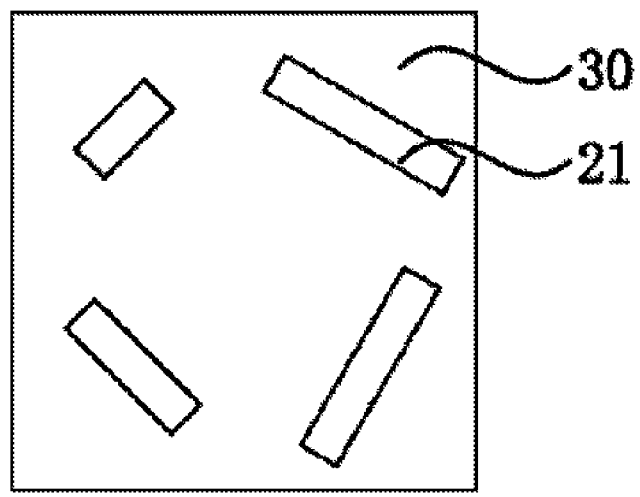
FIG. 5 is a top view of another bulk acoustic wave resonator according to an embodiment of the present disclosure.

FIG. 5 is a top view of another bulk acoustic wave resonator according to an embodiment of the present disclosure. Referring to FIGS. 1 to 5, sizes of the at least two slits 21 may the same or different, which is not limited in the embodiment. The specific size of the slit 21 may be determined according to the shape and the size of the bulk acoustic wave resonator as long as the noise can be reduced to a relatively large extent, which is not limited in the embodiment.

Optionally, the at least two slits are not parallel to each other.

Specifically, since the orthogonal projection of the slit 21 on the first electrode is not parallel to any side of the orthogonal projection of the piezoelectric layer on the first electrode and the at least two slits 21 are not parallel to each other, any slit 21 is not parallel to the side surface of the piezoelectric layer, and any slit 21 is not parallel to the side surface of the resonator. Therefore, it is further ensured that reflection directions of transverse waves between slits 21 and multiple side surfaces of the bulk acoustic wave resonator are different, so that it is not easy to form standing waves, the noise is further reduced, and the performance of the resonator is improved.

Optionally, the at least two slits 21 are asymmetrical.

In this way, the arrangement of the slits 21 are more disordered, so that it is further ensured that transverse waves propagate in different directions when propagating between the slits 21 and the side surface of the resonator, the formation of standing waves is further reduced, and the noise is further reduced.

Optionally, a shape of an orthogonal projection of the resonator on the first electrode is a square or a rectangle.

Specifically, according to the solution of the embodiment, the piezoelectric layer is provided with the slit, thus the formation of transverse standing waves can be effectively avoid, so that the resonator can adopt a regular shape such as a square or a rectangle. The manufacturing process of the regular-shaped resonator is simple, and the structural strength of the resonator is relatively good, so that according to the solution of the embodiment, the difficulty of the manufacturing process of the resonator is reduced and the structural strength of the resonator is improved.

Figure 6:
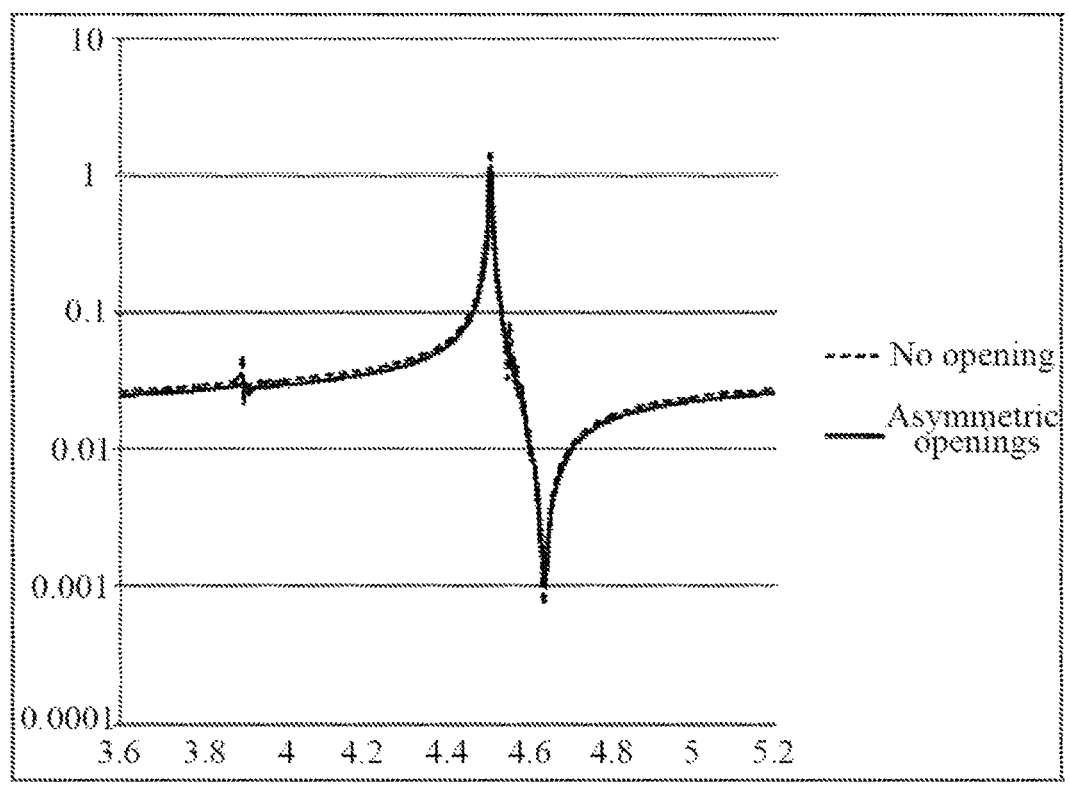
FIG. 6 is a graph showing resonance characteristics of a resonator according to an embodiment of the present disclosure.

FIG. 6 is a graph showing resonance characteristics of a resonator according to an embodiment of the present disclosure. FIG. 6 shows a simulation analysis graph of resonance characteristics of the structure shown in FIG. 5. Referring to FIG. 6, when the structure shown in FIG. 5 is adopted, the noise can be significantly reduced.

It is to be noted that the above are merely preferred embodiments of the present disclosure and the principles used therein. It will be understood by those skilled in the art that the present disclosure is not limited to the embodiments described herein. Various apparent modifications, readjustment, combinations and substitutions can be made by those skilled in the art without departing from the scope of the present disclosure. Therefore, while the present disclosure has been described in detail through the above embodiments, the present disclosure is not limited to the above embodiments and may include more other equivalent embodiments without departing from the concept of the present disclosure. The scope of the present disclosure is determined by the scope of the appended claims.

What is claimed is:

1. A bulk acoustic wave resonator, comprising:
a first electrode, a piezoelectric layer and a second electrode, wherein the piezoelectric layer is disposed between the first electrode and the second electrode, the piezoelectric layer is provided with at least one slit, and along a direction pointing from the first electrode to the second electrode, the at least one slit penetrates through at least the piezoelectric layer;
wherein an orthogonal projection of the at least one slit on the first electrode is not parallel to any side of an orthogonal projection of the piezoelectric layer on the first electrode; and
wherein a shape of the orthogonal projection of the at least one slit on the first electrode comprises a rectangle, an ellipse or a trapezoid; and
wherein a shape of an orthogonal projection of the bulk acoustic wave resonator on the first electrode is a circle, a square or a rectangle.

2. The bulk acoustic wave resonator according to claim 1, wherein
along the direction pointing from the first electrode to the second electrode, the at least one slit penetrates through the first electrode and the second electrode.

3. The bulk acoustic wave resonator according to claim 1, wherein
a width of the orthogonal projection of the at least one slit on the first electrode ranges from 5 μm to 15 μm.

4. The bulk acoustic wave resonator according to claim 1, wherein the piezoelectric layer is provided with at least two slits.

5. The bulk acoustic wave resonator according to claim 4, wherein the at least two slits are not parallel to each other.

6. The bulk acoustic wave resonator according to claim 4, wherein the at least two slits are asymmetrical.

* * * * *